United States Patent [19]

Stanojevic

[11] Patent Number: 4,701,639
[45] Date of Patent: Oct. 20, 1987

[54] THRESHOLD DETECTOR CIRCUIT AND METHOD

[75] Inventor: Silvo Stanojevic, Milpitas, Calif.

[73] Assignee: National Semiconductor Corporation, Santa Clara, Calif.

[21] Appl. No.: 806,982

[22] Filed: Dec. 9, 1985

[51] Int. Cl.$^4$ ............................................. H03K 5/153
[52] U.S. Cl. ..................................... 307/350; 307/106; 307/363
[58] Field of Search ................. 307/350, 362, 363, 98, 307/106

[56] References Cited

U.S. PATENT DOCUMENTS 4,385,243  5/1983  Suzuki .................................. 307/350
4,525,638  6/1985  Gray .................................... 307/350

OTHER PUBLICATIONS

F. C. Easter, "Voltage Monitor Circuit", RCA Technical Notes No. 1240, 2 sheets, 5-23-80.

Primary Examiner—John Zazworsky
Attorney, Agent, or Firm—Gail W. Woodward

[57] ABSTRACT

A threshold detector circuit and method for providing an output signal indicative of the relative magnitude of an input signal and a predetermined threshold value. The circuit, which is powered by the input signal and does not require a separate power source, includes a reference stage which switches from one state to another state when the input to the reference exceeds a predetermined reference voltage. The reference voltage is equal to the sum of two voltages having positive and negative temperature coefficients, respectively so that the total coefficient is small. A pair of transistors operating at different emitter current densities provide a difference in base-to-emitter voltages used to derive the first voltage and an absolute base-to-emitter voltage is used for the second voltage. An input stage is included which has a transistor for coupling the detector input to the reference stage input. The input transistor is saturated when the detector input approaches the threshold voltage so that the overall temperature coefficient remains low. An output stage produces an output signal which changes when the input signal causes the reference stage to change states.

24 Claims, 1 Drawing Figure

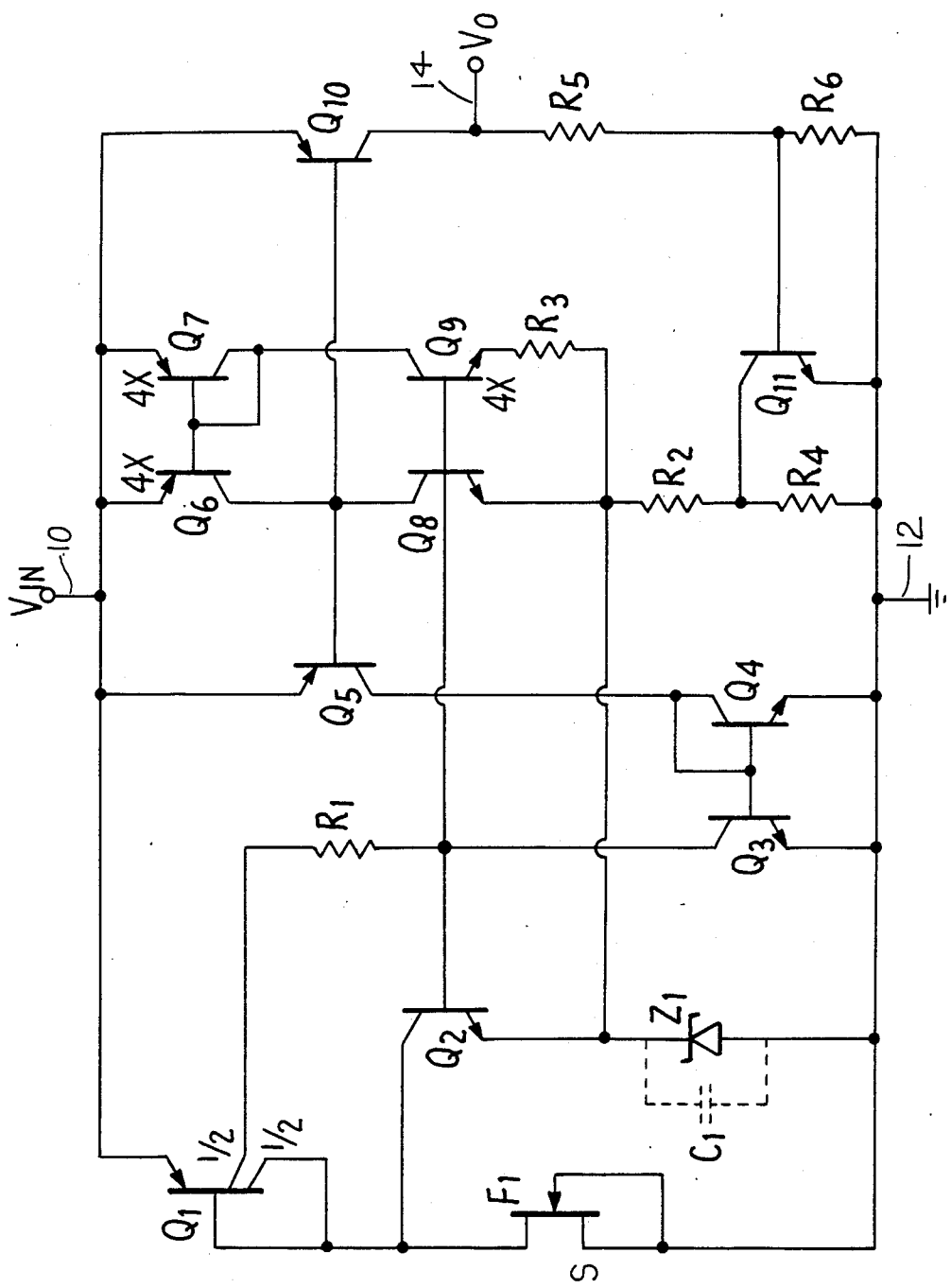

THRESHOLD DETECTOR CIRCUIT AND METHOD

TECHNICAL FIELD OF INVENTION

The present invention relates generally to electronic circuits and more particularly to a threshold detector circuit and method wherein the circuit is powered by the input signal to the circuit.

BACKGROUND ART

Circuits for detecting when a signal has reached a predetermined threshold are well known in the art. Typically, a reference voltage is produced which is compared with the input signal by a comparator circuit. When the input signal increases to a value equal to the magnitude of the reference voltage, the output of the comparator circuit changes state.

In many applications, especially when the principal source of power is a battery, it is desirable to reduce current consumption to a minimum. A principal disadvantage of prior art threshold detector circuits is that a large amount of power is typically consumed. In addition, circuitry for producing a voltage reference which is stable over temperature, together with a separate comparator circuit, is relatively complex.

The present invention overcomes the above-noted limitations of the prior art circuits. Power consumption is very low and is almost negligible when the input signal, typically a digital signal, is in a low state. Moreover, the entire circuit may be powered by the input signal, even though such signal may be produced by a source having limited current drive capabilities, such as the output of a logic gate. In addition, many of the functions provided by a separate voltage reference and comparator can be combined so as to minimize parts count yet provide threshold voltage stability over temperature. The subject invention is further advantageous in that it can be readily implemented in integrated circuit form.

These and other advantages of the present invention will become apparent to those skilled in the art upon a reading of the following Best Mode for Carrying Out the Invention together with the drawings.

DISCLOSURE OF THE INVENTION

A threshold detector circuit and method for providing an output signal indicative of the relative magnitude of an input signal with respect to a predetermined threshold value as disclosed. The circuit includes a reference stage switchable from a first to a second state when an input to the stage exceeds a predetermined reference value. The reference stage, and preferably the entire circuit, is powered substantially exclusively by the detector input signal and does not require a separate power source.

The detector further includes an input stage for coupling the detector input to the reference stage. The input stage preferably provides a signal path which includes the collector and emitter conduction path of a transistor which is saturated when the input signal approaches the predetermined threshold.

A sensing circuit is provided for determining the state of the reference circuit and for producing the detector output signal indicative of such state. In one embodiment, the sensing circuit is a PNP transistor, with the emitter coupled to the input signal and the base coupled to the reference circuit stage.

The reference stage is preferably implemented to provide a reference value having a low temperature coefficient. A pair of transistors are configured to provide a reference value which is equal to the sum of two approximately equal voltages, with the first voltage having a positive temperature coefficient and the second voltage having a negative temperature coefficient. The transistors are operated at differing current densities so that the first voltage can be derived from the difference between the base-to-emitter voltages of the two transistors, with such difference voltage having a positive temperature coefficient. The base-to-emitter voltage of the high current density transistor, which has a negative temperature coefficient, is used as the second voltage.

BRIEF DESCRIPTION OF THE DRAWINGS

The drawings depict a schematic circuit diagram of a preferred embodiment of the subject invention.

BEST MODE FOR CARRYING OUT THE INVENTION

Referring now to the drawings, a schematic circuit diagram of a preferred embodiment of the subject invention may be seen. The circuit can be implemented in integrated form using well known manufacturing processes. The input terminal 10 of the threshold detector is connected to the emitter of a multiple-collector PNP transistor $Q_1$. The collector regions of $Q_1$ are such that the total collector current is split equally between the collectors.

One collector of $Q_1$ is connected to the base of the transistor and also to the drain of an N channel JFET $F_1$. The source and gate of transistor $F_1$ are connected to a circuit common 12. Under normal operating voltages, the drain voltage is less than the pinchoff voltage so that transistor $F_1$ can be considered equivalent to a resistor of approximately 10 megohms.

The remaining collector of $Q_1$ is connected to the base of a transistor $Q_2$ through a resistor $R_1$. The collector of $Q_2$ is connected to the junction between $Q_1$ and $F_1$ and the emitter is connected to common terminal 12 by way of a Zener diode $Z_1$. At normal operating voltages, $Z_1$ never is in an avalanche mode and can be considered equivalent to a small capacitor $C_1$ having a capacitance of 50 pF.

The base of transistor $Q_2$ is also connected to the collector of a second NPN transistor $Q_3$, with the emitter of $Q_3$ being connected to common terminal 12. The base of transistor $Q_3$ is connected to the base of another NPN transistor $Q_4$. The emitter of $Q_4$ is connected to the circuit common and the collector is connected to the base of the transistor. Transistors $Q_3$ and $Q_4$ function together as a current mirror. The geometry of the devices is the same so that collector current flow through the transistors will be substantially equal when in the active state.

The collector of $Q_4$ is also connected to the collector of a PNP transistor $Q_5$, with the emitter of $Q_5$ being connected to input terminal 10. The base of $Q_5$ is connected to the base of an output PNP transistor $Q_{10}$. The emitter of output transistor $Q_{10}$ is connected to the input terminal 10 and the collector is connected to the circuit output terminal 14. The collector is also coupled to the common terminal 12 by way of a series-connected load resistors $R_5$ and $R_6$. Transistors $Q_5$ and $Q_{10}$ function together as a current mirror.

A pair of NPN transistors $Q_8$ and $Q_9$ are included, having their respective bases connected together and to the base of transistor $Q_2$. The emitter of transistor $Q_8$ is connected to common terminal 12 through series-connected resistors $R_2$ and $R_4$ and to the emitter of $Q_2$. The emitter of transistor $Q_9$ is connected to the emitter of $Q_8$ through a resistor $R_3$. As will be described late in greater detail, transistor $Q_9$ has four times the emitter area of transistor $Q_8$ so that the two transistors will operate at different predetermined current densities.

The collector of transistor $Q_8$ is connected to the collector of a PNP transistor $Q_6$ and to the bases of transistors $Q_5$ an $Q_{10}$. The emitter of transistor $Q_6$ is connected to input terminal 10 and the base is connected to the base of another PNP transistor $Q_7$. The emitter of $Q_7$ is also connected to input terminal 10 and the base and collector of $Q_7$ are both connected to the collector of $Q_9$.

Transistors $Q_6$ and $Q_7$ are configured to operate as a current mirror and have equal emitter areas. For reasons to be subsequently explained, the emitter areas are relatively large in comparison to the other PNP transistors of the circuit so that the base-to-emitter voltage of transistor $Q_7$ will be minimized.

Another NPN transistor $Q_{11}$ is included having its emitter connected to circuit common 12 and the collector connected to the junction of resistors $R_2$ and $R_4$. The base of $Q_{11}$ is connected to the junction of output resistors $R_5$ and $R_6$. Transistor $Q_{11}$ provides a threshold hysteresis, as will be subsequently described.

Having described the construction of the subject detector, a description will now be given of the operation of the circuit. The input $V_{in}$ applied to terminal 10 is typically the output of a gate or other circuit having limited drive capability and is switchable between a low voltage state of approximately +0.10 volts and a high voltage state of approximately +4.5–5.5 volts. The subject detector is implemented to detect the point at which $V_{in}$ reaches a predetermined threshold voltage for positive-going transistions. No power source other than the input signal $V_{in}$ is required.

When $V_{in}$ is a few tenths of a volt, none of the various transistors of the subject circuit are conducting; therefore, the circuit draws a negligible amount of current in the this state. As the input voltage increases, transistor $Q_1$ begins to turn on. FET $F_1$, which acts as a very high impedance resistor, sets up a current flow through one collector of $Q_1$, with the current being mirrored in the remaining collector.

Transistor $Q_1$ provides base drive to transistor $Q_2$ through resistor $R_1$, with the resistor having a resistance of 24 kohm. Ignoring, for the time being, the capacitive effect of Zener $Z_1$ (capacitor $C_1$), the current flowing out of the emitter of $Q_2$ will flow through resistors $R_2$ and $R_4$. The collector current through $Q_2$ is drawn from one of the collectors of $Q_1$, thereby causing the other collector of $Q_1$ to provide further base drive current for $Q_2$. Accordingly, transistors $Q_1$ and $Q_2$ form a positive feedback current loop which decreases the turn-on time of the circuit.

The base-emitter voltage of $Q_2$ is applied to the base-emitter junction of transistor $Q_8$ so that the two devices form a current mirror. Transistor $Q_8$ thus proceeds to turn on, as does transistor $Q_9$. Collector current of $Q_9$ is drawn through the base-emitter diode formed from transistor $Q_7$. The voltage developed across the base-emitter junction of transistor $Q_7$ causes equal current flow through $Q_6$.

Base drive to transistors $Q_2$, $Q_8$ and $Q_9$ is provided by signal $V_{in}$ by way of transistor $Q_1$ and resistor $R_1$. Transistor $Q_1$ is saturated; therefore the voltage applied to the bases of $Q_2$, $Q_8$ and $Q_9$ is equal to the $V_{in}$, less the saturation voltage of $Q_1$ and the small voltage drop across $R_1$ which totals roughly 130 millivolts.

When $V_{in}$ is less than the threshold voltage, the collector current of transistor $Q_8$ is less than the current which transistor $Q_6$ is capable of providing. Accordingly, transistor $Q_6$ is saturated and the collector of transistor $Q_8$ is pulled up to almost at $V_{in}$, thereby causing transistors $Q_5$ and $Q_{10}$ to remain turned off.

As $V_{in}$ increases, the base voltages of $Q_8$ and $Q_9$ increases and the collector currents through the two transistors approach equality. As $V_{in}$ approaches the threshold voltage, transistor $Q_8$ is capable of sinking all of the current provided by $Q_6$ so that $Q_6$ will go out of saturation. Current flow through transistors $Q_2$, $Q_8$ and $Q_9$ will then be substantially equal.

Transistor $Q_9$ has four times the emitter area of transistor $Q_8$; therefore, the current density through transistor $Q_8$ will be four times that of $Q_9$. As is well known, such a difference in current density will produce a difference base-emitter voltage, $\Delta V_{BE}$, which is dropped across resistor $R_3$. At 300° K., $\Delta V_{BE}$ is equal to 36 millivolts for a current density ratio of four-to-one.

The value of resistor $R_3$ determines the equilibrium current flow through the various transistors of the subject circuit when input signal $V_{in}$ is near or above the threshold voltage. Assuming that $R_3$ has a value of 12 Kohm, the collector current I of $Q_9$ will be 3 μA, ignoring base current. The collector current of $Q_8$ will also be equal to I because of the current mirror configuration of transistors $Q_6$ and $Q_7$. The collector current of transistor $Q_2$ will also be equal to I since transistors $Q_2$ and $Q_8$ are configured as a current mirror.

The collector currents of $Q_2$, $Q_8$ and $Q_9$ flow through series-connected resistors $R_2$ and $R_4$. Thus, the total current through the resistors is 3I and, assuming the total resistance of $R_2$ and $R_4$ is 84 Kohm, the voltage at the emitter of $Q_8$ is $[3(R_2+R_4)/R_3]\Delta V_{BE}$ or 756 millivolts. The bases of transistors $Q_8$ and $Q_9$ are equal to 756 millivolts plus $V_{BE}$ of transistor $Q_8$, or approximately 1.40 volts. The voltage developed across resistors $R_2$ and $R_4$ is proportional to the $\Delta V_{BE}$ which, as is well known, has a temperature coefficient opposite to that of $V_{BE}$. When the total voltage is equal to the band gap voltage of silicon (about 1.2 volts), the temperature coefficient of the two components are equal and opposite so that a reference voltage will be produced at the bases of $Q_8$ and $Q_9$ which is relatively independent of temperature.

As $V_{in}$ slightly increases further, transistor $Q_8$ will be capable of sinking more current than transistor $Q_6$ can provide. As a result, the collector voltage of $Q_8$ will drop causing transistors $Q_5$ and $Q_{10}$ to begin to turn on. As transistor $Q_{10}$ turns on, the output $V_0$ of the threshold detector at terminal 14 goes high. Transistors $Q_8$ and $Q_9$ form part of a voltage reference stage, with the stage being in a first state when transistor $Q_5$ and $Q_{10}$ are on and a second state when the transistors are off. Collector current of $Q_5$ will produce a voltage across the base-emitter diode of $Q_4$ causing $Q_3$ to turn on. Transistor $Q_3$ will turn on until it is conducting the same amount of collector current as transistor $Q_2$, namely I, because of the current mirror function provided by transistor $Q_1$. Accordingly, at equilibrium, the current flow through transistors $Q_2$, $Q_3$, $Q_4$, $Q_8$, $Q_9$ and $Q_{10}$ will all be equal to I, giving a total current consumption of 6I or about 18 $\mu$A, independent of $V_{in}$. It can be seen that a negative feedback loop is formed from collector to base of transistor $Q_8$. The collector of transistor $Q_8$ directly drives the base of transistor $Q_5$, which will conduct a current equal to that flowing in transistor $Q_{10}$, and the current in transistor $Q_5$ will flow in transistor $Q_4$. This current is mirrored in transistor $Q_3$ which is directly connected to the base of transistor $Q_8$. This negative feedback loop will stabilize the operation of transistor $Q_8$ and is operative when $V_{in}$ is above the threshold level.

When transistor $Q_{10}$ has turned on, a voltage is developed across resistor $R_6$ which turns on transistor $Q_{11}$. $Q_{11}$ reduces the voltage across resistor $R_4$ to the saturation voltage of the transistor, thereby lowering the reference voltage and, therefore, the circuit input threshold voltage. This hysteresis prevents the output $V_0$ from toggling as a result of noise superimposed on input $V_{in}$ when the input is near the threshold voltage. Resistor $R_4$ will typically have a value of 22 Kohm and $R_2$ a value of 62 Kohm so that the threshold voltage will be reduced by approximately 200 millivolts once output $V_0$ goes high.

Capacitor $C_1$ appears as a short circuit during initial turn on, thereby providing a low impedance current path for the emitter current of $Q_2$. This serves to increase the response time of the subject circuit. The same results could be achieved by reducing the values of resistors $R_2$, $R_3$ and $R_4$, but the result would be substantially increased power consumption.

The threshold voltage of the circuit is equal to the reference voltage at the input to the voltage reference stage (the bases of transistors $Q_2$, $Q_8$ and $Q_9$) when the reference stage is in the second state, plus the saturation voltage of transistor $Q_1$, together with the drop across resistor $R_1$. As previously noted, the reference voltage is essentially independent of temperature. The voltage drop across resistor $R_1$ is approximately 70 millivolts and the saturation voltage of $Q_1$ is approximately 50 millivolts. Although the $Q_1$ saturation voltage has a non-zero temperature coefficient, the total contribution to the threshold voltage is sufficiently small such that variations in the threshold with temperature are not significant for most applications.

As input $V_{in}$ increases further, the total circuit current consumption will remain relatively constant. Transistor $Q_1$ will go out of saturation, with the difference between $V_{in}$ and the threshold voltage being dropped across the transistor. As previously noted, transistor $Q_7$, and thus transistor $Q_6$, have a relatively large emitter area so as to reduce the voltage drop across $Q_7$. This ensures that the drop across transistor $Q_1$ and resistor $R_1$ will be sufficiently large in comparison to the drop across transistor $Q_7$ such that the transistor $Q_9$ will never become saturated.

Thus, a novel threshold detector circuit powered by the input signal and method have been disclosed. Although a preferred embodiment has been described in some detail, it is to be understood that various changes can be made by persons skilled in the art without departing from the spirit and scope of the invention as defined by the appended claims.

I claim:

1. A threshold detector circuit for producing an output signal indicative of the relative magnitude of a detector input signal with respect to a predetermined threshold value, said circuit comprising:

reference means having an input coupled to receive said detector input signal and including first and second transistors operating at different current densities, for switching from a first state, in which said first and second transistors are substantially nonconductive, to a second state, in which said first and second transistors conduct substantially equal currents when the magnitude of said detector input signal exceeds a predetermined reference value, said reference means being powered substantially exclusively by said detector input signal; and sensing means for producing said output signal in response to said first and second states of said reference means.

2. The detector circuit of claim 1 wherein said predetermined reference value includes a first component which is a function of a difference in base-to-emitter voltages of said first and second transistors.

3. The detector circuit of claim 2 wherein said reference value includes a second component which is a function of the base-to-emitter voltage of one of said first and second transistors.

4. The detector circuit of claim 3 wherein said reference means includes negative feedback means coupled between the collector of one of said first and second transistors and the bases of said first and second transistors for controlling current flow in said first and second transistors.

5. The detector circuit of claim 4 wherein said feedback means includes a third transistor, with the base of said third transistor coupled to the collector of one of said first and second transistors.

6. The detector circuit of claim 5 wherein said feedback means further includes a fourth transistor, with current flow through said fourth transistor being controlled by said third transistor and the collector of said fourth transistor is coupled to said bases of said first and second transistors.

7. The detector circuit of claim 6 wherein said third transistor is a PNP transistor and said fourth transistor is an NPN transistor.

8. The detector circuit of claim 6 wherein said input means provides a signal path for said input signal to said reference means and includes a fifth transistor, with the current path in said fifth transistor between the emitter and a first collector forming part of said signal path.

9. The detector circuit of claim 8 wherein said input means further includes positive feedback means for increasing base current drive to said fifth transistor in response to an increase in current flow through said first collector of said fifth transistor.

10. The detector circuit of claim 9 wherein said positive feedback means includes a sixth transistor, with the collector of said sixth transistor coupled to the base of said fifth transistor.

11. The detector circuit of claim 10 wherein said fifth transistor is a PNP transistor, with the emitter of said fifth transistor coupled to said input signal and said first collector coupled to said reference means.

12. The detector circuit of claim 11 wherein said first collector of said fifth transistor is coupled to said reference means through a first impedance.

13. The detector circuit of claim 11 wherein said fifth transistor includes a second collector coupled to a circuit common through a second impedance.

14. The detector circuit of claim 13 wherein said second collector and said base of said fifth transistor are coupled together.

15. The detector circuit of claim 13 wherein said sensing means includes a seventh transistor, with the base of said seventh transistor coupled to said reference means.

16. The detector circuit of claim 15 wherein said base of said seventh transistor is coupled to a collector of one of said first and second transistors.

17. The detector of claim 16 wherein said third and seventh transistors are PNP transistors having their respective emitters coupled together.

18. A threshold detector circuit for producing an output signal indicative of the relative magnitude of a detector input signal with respect to a predetermined threshold value, said circuit comprising:

reference means for switching from a first state to a second state when the magnitude of a reference input signal exceeds a predetermined value, said reference means including a pair of transistors having commonly-coupled bases which receive said reference input signal and wherein the collector currents of said first and second transistors are provided substantially exclusively by said detector input signal;

input signal path means for coupling said detector input signal to said reference means, thereby to create said reference input signal, with said input signal path means including a transistor wherein the current path in said input transistor between emitter and collector forms a part of said input signal path means; and sensing means for producing said output signal in response to said state of said reference means.

19. The detector circuit of claim 18 wherein said input means includes positive feedback means for increasing base current drive to said input transistor in response to an increase in collector current flow through said input transistor.

20. The detector circuit of claim 18 wherein said sensing means includes an output transistor having an emitter coupled to said detector input signal and a base coupled to said reference means.

21. A method for providing an output signal indicative of the relative magnitude of a detector input signal with respect to a predetermined threshold value, said method comprising the following steps:

providing a reference circuit configured to include a pair of transistors operated at different current densities and switchable from a first to a second state when the magnitude of said detector input signal input exceeds a predetermined reference value, with said reference circuit being powered substantially exclusively by said detector input signal;

coupling said detector input signal to said reference circuit through a signal path which includes a current path of an input transistor between the collector and emitter thereof; and generating said output signal indicative of said state of said reference circuit.

22. The method of claim 21 wherein said coupling step includes the step of providing positive feedback current drive to the base of said input transistor.

23. The method of claim 21 wherein said predetermined reference value is proportional to the sum of a first voltage having a positive temperature coefficient and a second voltage having a negative temperature coefficient.

24. The method of claim 21 wherein said input transistor is saturated when said detector input signal magnitude is approximately equal to said predetermined reference value.

* * * * *